(12) United States Patent
Huang

(10) Patent No.: US 10,326,016 B2
(45) Date of Patent: Jun. 18, 2019

(54) HIGH-SIDE POWER DEVICE AND MANUFACTURING METHOD THEREOF

(71) Applicant: RICHTEK TECHNOLOGY CORPORATION, Zhubei, HsinChu (TW)

(72) Inventor: Tsung-Yi Huang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/038,015

(22) Filed: Jul. 17, 2018

(65) Prior Publication Data
US 2018/0342612 A1 Nov. 29, 2018

Related U.S. Application Data

(62) Division of application No. 15/192,741, filed on Jun. 24, 2016, now Pat. No. 10,056,480.

(60) Provisional application No. 62/242,479, filed on Oct. 16, 2015.

(51) Int. Cl.
| | |
|---|---|
| *H01L 21/762* | (2006.01) |
| *H01L 29/78* | (2006.01) |
| *H01L 29/06* | (2006.01) |
| *H01L 29/10* | (2006.01) |
| *H01L 29/66* | (2006.01) |
| *H01L 29/08* | (2006.01) |
| *H01L 29/423* | (2006.01) |

(52) U.S. Cl.
CPC .... *H01L 29/7816* (2013.01); *H01L 21/76205* (2013.01); *H01L 29/0623* (2013.01); *H01L 29/0649* (2013.01); *H01L 29/0878* (2013.01); *H01L 29/0886* (2013.01); *H01L 29/1095* (2013.01); *H01L 29/66681* (2013.01); *H01L 29/42368* (2013.01)

(58) Field of Classification Search
CPC ........... H01L 21/4871; H01L 21/76205; H01L 29/0623; H01L 29/0649; H01L 29/0878; H01L 29/0886; H01L 29/1095; H01L 29/66681; H01L 29/7816
See application file for complete search history.

(56) References Cited

U.S. PATENT DOCUMENTS

2002/0017683 A1\* 2/2002 Jeon ...................... H01L 21/761
257/339

\* cited by examiner

*Primary Examiner* — Cuong Q Nguyen
(74) *Attorney, Agent, or Firm* — Tung & Associates

(57) ABSTRACT

A high-side device includes: a substrate, an epitaxial layer, a high voltage well, a body region, a gate, a source, a drain, and a buried region. A channel junction is formed between the body region and the high voltage well. The buried region is formed in the substrate and the epitaxial layer, and in a vertical direction, a part of the buried region is located in the substrate and another part of the buried region is located in the epitaxial layer. In the channel direction, an inner side boundary of the buried region is between the drain and the channel junction. An impurity concentration of a second conductive type of the buried region is sufficient to prevent the high voltage well between the channel junction and the drain from being completely depleted when the high-side power device operates in a conductive operation. A corresponding manufacturing method is also disclosed.

5 Claims, 9 Drawing Sheets

HIGH-SIDE POWER DEVICE AND MANUFACTURING METHOD THEREOF

CROSS REFERENCE

This is a Divisional of a co-pending application Ser. No. 15/192,741, filed on Jun. 24, 2016.

The present invention claims priority to US 62/242479, filed on Oct. 16, 2015.

BACKGROUND OF THE INVENTION

Field of Invention

The present invention relates to a high-side power device and a manufacturing method thereof; particularly, it relates to such a high-side power device having a reduced conduction resistance, and a manufacturing method thereof.

Description of Related Art

FIG. 1A shows a schematic diagram of a typical switching regulator 10. The switching regulator 10 has a high-side switch UG and a low-side switch LG as shown in the figure. A high-side gate driver circuit 13 and a lower gate driver 14 drive the high-side switch UG and the low-side switch LG respectively. A control circuit 11 controls the high-side gate driver circuit 13 (through a level shifter circuit 12) and the lower gate driver circuit 14. The level shifter circuit 12 is required when the input voltage Vin is a relatively high voltage, such as 400V; in this case, the level shifter circuit 12 provides the required signal level to the high-side gate driver circuit 13 so as to properly drive the high-side switch UG. Although the voltage drops between the operation terminals of the high-side switch UG, such as its source, drain, and gate, are not high relatively to the input voltage Vin, the high-side switch UG is still required to withstand a high voltage drop between the input voltage Vin and the ground level GND, because the high-side switch UG and the low-side switch LG are typically formed in a same substrate, and the substrate is usually electrically connected to the ground level GND.

FIG. 1B shows a schematic diagram of a cross-section view of a prior art high-side power device 100, for use as the high-side switch UG. As shown in FIG. 1B, the high-side power device 100 includes a substrate 101, an isolation oxide region 103, a high voltage well 105, a body region 106, a source 108, a drain 109, and a gate 111. The high voltage well 105 has an N-type conductive type and is formed in the substrate 101 which has a P-type conductive type. The isolation oxide region 103 is a local oxidation of silicon (LOCOS) structure, which defines an operation region 103a as a major active region of the high-side power device 100. The operation region 103a is shown in FIG. 1B as a region defined by two arrows. When the high-side power device 100 is used as the high-side switch UG, the substrate 101 of the high-side power device 100 is electrically connected to the ground level GND, and the high voltage well 102 is at a relatively high electric level; in a conduction operation, the high voltage well 102 in the operation region 103a is completely depleted, and therefore the conduction resistance is high, restricting the operation speed and operation performance of the high-side power device 100.

In view of the above, to overcome the drawbacks in the prior art, the present invention proposes a high-side power device having a reduced conduction resistance, and a manufacturing method thereof.

SUMMARY OF THE INVENTION

In one perspective, the present invention provides a high-side power device. The high-side power device includes: a substrate having a first conductive type, which includes a top surface and a bottom surface opposite to the top surface in a vertical direction; an epitaxial layer, which is formed on the substrate, and has an epitaxial surface opposite to the top surface in the vertical direction, wherein the epitaxial layer is stacked on and in contact with at least a portion of the top surface of the substrate; a high voltage well having a second conductive type, which is formed in the epitaxial layer, and is in contact with the top surface in the vertical direction; a body region having the first conductive type, which is formed in the epitaxial layer beneath the epitaxial surface, and connects the epitaxial surface in the vertical direction, wherein the body region and the high voltage well form a channel junction in a channel direction; a gate, which is formed on the epitaxial layer, and is stacked on and in contact with the epitaxial surface in the vertical direction, wherein the gate covers at least a part of the channel junction from a top view; a source having the second conductive type, which is formed in the epitaxial layer, and is beneath and connects the epitaxial surface in the vertical direction, wherein the source is located in the body region from the top view; a drain having the second conductive type, which is formed in the epitaxial layer, and is beneath and connects the epitaxial surface, wherein the drain and the source are located at different sides of the channel junction in the channel direction, wherein the drain and the gate are separated by the high voltage well from the top view; and a buried region having the second conductive type, which is formed in the substrate and the epitaxial layer, wherein a part of the buried region is located in the substrate and another part of the buried region is located in the epitaxial layer in the vertical direction, wherein an inner boundary of the buried region is located between the drain and the channel junction in the channel direction, and the buried region is not located vertically under the source and does not overlap the source from the top view; wherein a concentration of the second conductive type impurities of the buried region is higher than a predetermined threshold to prevent the high voltage well between the channel junction and the drain from being completely depleted in a conductive operation.

In one perspective, the present invention also provides a manufacturing method of a high-side power device. The manufacturing method includes: providing a substrate having a first conductive type, which includes a top surface and a bottom surface opposite to the top surface in a vertical direction; forming an epitaxial layer on the substrate, wherein the epitaxial layer has an epitaxial surface opposite to the top surface in the vertical direction, and is stacked on and in contact with at least a portion of the top surface of the substrate; forming a high voltage well having a second conductive type in the epitaxial layer, wherein the high voltage well is stacked on and in contact with the top surface in the vertical direction; forming a body region having the first conductive type in the epitaxial layer, wherein the body region is beneath the epitaxial surface and connects the epitaxial surface in the vertical direction, and wherein the body region and the high voltage well form a channel junction in a channel direction; forming a gate on the epitaxial layer, wherein the gate is stacked on and in contact with the epitaxial surface in the vertical direction, and wherein the gate covers at least a part of the channel junction from a top view; forming a source having the second conductive type in the epitaxial layer, wherein the source is beneath and connects the epitaxial surface in the vertical direction, and wherein the source is located in the body region from the top view; forming a drain having the second conductive type in the epitaxial layer, the drain being beneath and connecting the epitaxial surface, wherein the drain and the source are located at different sides of the channel junction in the channel direction, and wherein the drain and the gate are separated by the high voltage well from the top view; and forming a buried region having the second conductive type in the substrate and the epitaxial layer, wherein a part of the buried region is located in the substrate and another part of the buried region is located in the epitaxial layer in the vertical direction, wherein an inner boundary of the buried region is located between the drain and the channel junction in the channel direction, and the buried region is not located vertically under the source and does not overlap the source from the top view; wherein a concentration of the second conductive type impurities of the buried region is higher than a predetermined threshold to prevent the high voltage well between the channel junction and the drain from being completely depleted in a conductive operation.

In one preferable embodiment, a distance between the inner boundary and the drain in the channel direction is longer than a quarter of a drift length between the channel junction and the drain in the channel direction.

In one preferable embodiment, the high-side power device further includes an isolation oxide region, which is formed on the epitaxial layer, for defining an operation region, wherein the body region, the source, and the drain are all located in the operation region from the top view.

In the aforementioned embodiment, the high-side power device preferably further includes a drift oxide region, which is formed in the operation region on the epitaxial layer, and is stacked on and in contact with the high voltage well in the vertical direction, wherein the drift oxide region is located between the channel junction and the drain in the channel direction.

In one preferable embodiment, the high-side power device further includes a contact region having the first conductive type, which is formed in the epitaxial layer, and is stacked beneath and connects the epitaxial surface, wherein the contact region is located in the body region from the top view.

In one perspective, the present invention also provides a high-side power device. The high-side power device includes: a substrate having a first conductive type, which includes a top surface and a bottom surface opposite to the top surface in a vertical direction; a high voltage well having a second conductive type, which is formed in the substrate, and is beneath the top surface in the vertical direction; a body region having the first conductive type, which is formed in the substrate beneath the top surface, wherein the body region and the high voltage well form a channel junction in a channel direction; a gate, which is formed on the substrate, and is stacked on and in contact with the top surface in the vertical direction, wherein the gate covers at least a part of the channel junction from a top view; a source having the second conductive type, which is formed in the substrate, and is beneath and connects the top surface in the vertical direction, wherein the source is located in the body region from the top view; a drain having the second conductive type, which is formed in the substrate, and is beneath and connects the top surface, wherein the drain and the source are located at different sides of the channel junction in the channel direction, and wherein the drain and the gate are separated by the high voltage well from the top view; and a buried region having the second conductive type, which is formed in the substrate, and is located below the drain in the vertical direction, wherein an inner boundary of the buried region is located between the drain and the channel junction in the channel direction, and the buried region is not located vertically under the source and does not overlap the source from the top view; wherein a concentration of the second conductive type impurities of the buried region is higher than a predetermined threshold to prevent the high voltage well between the channel junction and the drain from being completely depleted in a conductive operation.

In one perspective, the present invention also provides a manufacturing method of a high-side power device. The manufacturing method includes: forming a substrate having a first conductive type, which includes a top surface and a bottom surface opposite to the top surface in a vertical direction; forming a high voltage well having a second conductive type in the substrate, wherein the high voltage well is beneath the top surface in the vertical direction; forming a body region having the first conductive type in the substrate beneath the top surface, wherein the body region and the high voltage well form a channel junction in a channel direction; forming a gate on the substrate, wherein the gate is stacked on and in contact with the top surface in the vertical direction, wherein the gate covers at least a part of the channel junction from a top view; forming a source having the second conductive type in the substrate, wherein the source is beneath and connects the top surface in the vertical direction, and wherein the source is located in the body region from the top view; forming a drain having the second conductive type in the epitaxial layer, the drain being beneath and connecting the epitaxial surface, wherein the drain and the source are located at different sides of the channel junction in the channel direction, and wherein the drain and the gate are separated by the high voltage well from the top view; and forming a buried region having the second conductive type in the substrate, wherein the buried region is located below the drain in the vertical direction, wherein an inner boundary of the buried region is located between the drain and the channel junction in the channel direction, and the buried region is not located vertically under the source and does not overlap the source from the top view; wherein a concentration of the second conductive type impurities of the buried region is higher than a predetermined threshold to prevent the high voltage well between the channel junction and the drain from being completely depleted in a conductive operation.

In one preferable embodiment, a distance between the inner boundary and the drain in the channel direction is longer than a quarter of a drift length between the channel junction and the drain in the channel direction.

In one preferable embodiment, the high-side power device further includes an isolation oxide region, which is formed on the substrate, for defining an operation region, wherein the body region, the source, and the drain are all located in the operation region from the top view.

In the aforementioned embodiment, the high-side power device preferably further includes a drift oxide region, which is formed in the operation region on the substrate, and is stacked on and in contact with the high voltage well in the vertical direction, wherein the drift oxide region is located between the channel junction and the drain in the channel direction.

In one preferable embodiment, the high-side power device further includes a contact region having the first conductive type, which is formed in the substrate, and is stacked beneath and connects the top surface, wherein the contact region is located in the body region from the top view.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
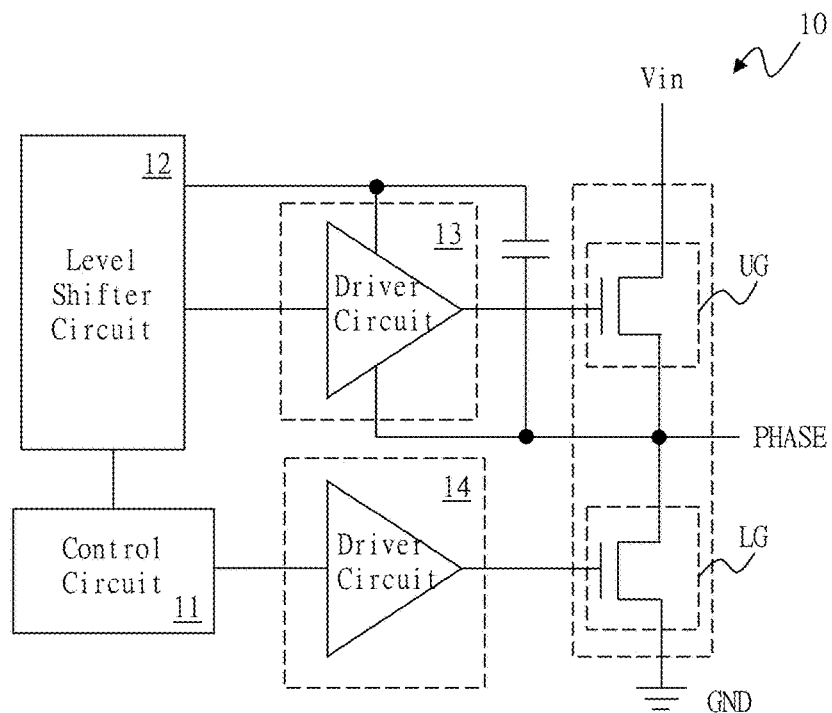
FIG. 1A shows a schematic diagram of a typical switching regulator 10.
Figure 1B:
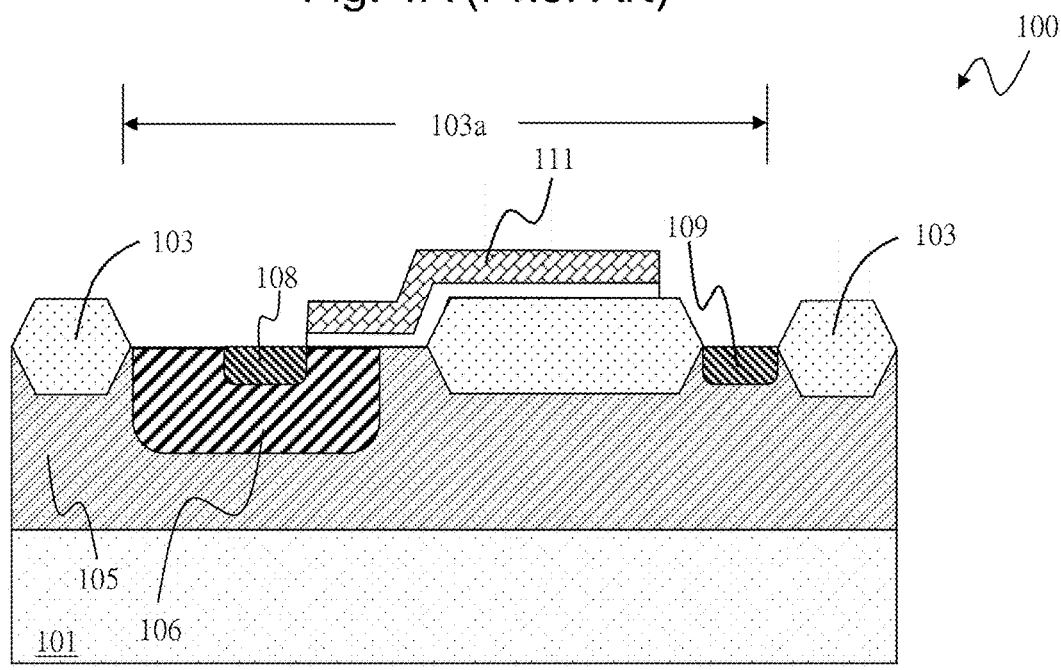
FIG. 1B shows a schematic diagram of a cross-section view of a prior art high-side power device 100.
Figure 2A:
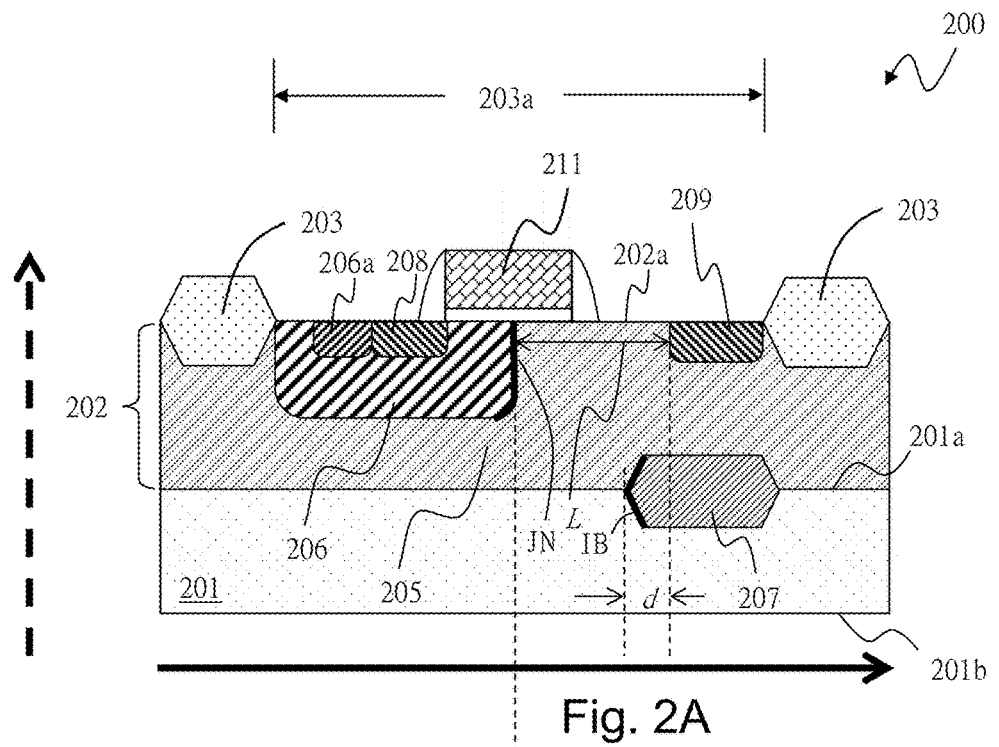
FIGS. 2A and 2B show a first embodiment of the present invention.
Figure 2B:
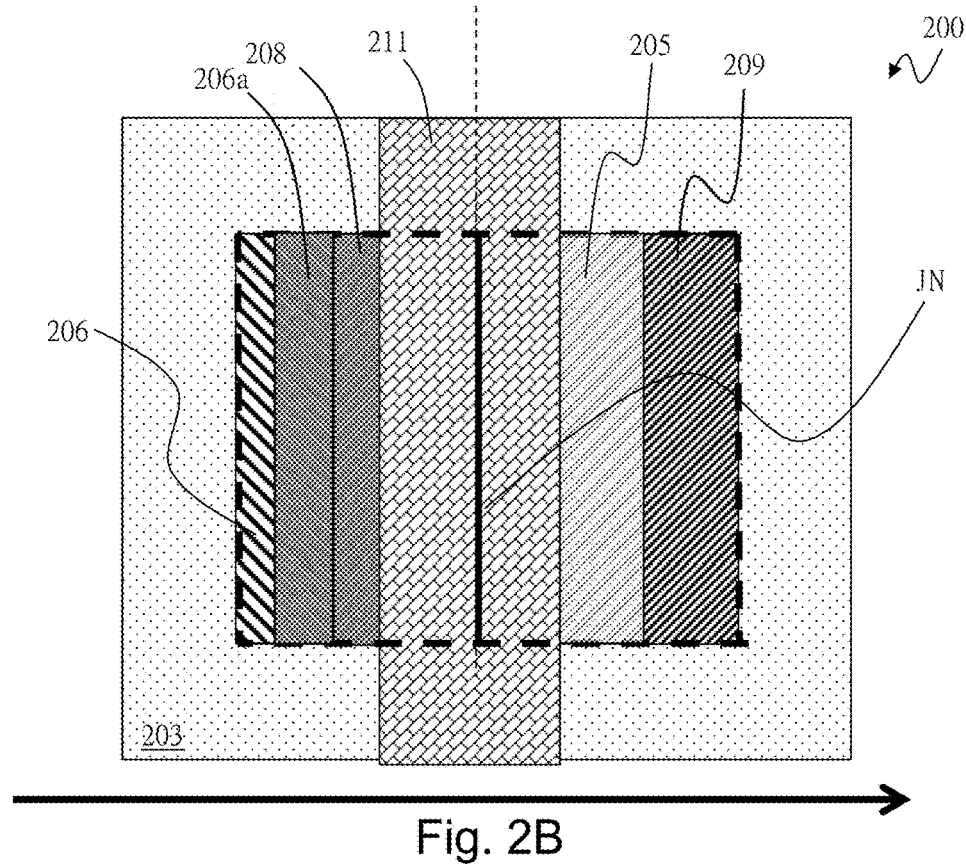

Please refer to FIGS. 2A and 2B for a first embodiment according to the present invention. FIG. 2A shows a schematic diagram of a cross-section view of a high-side power device 200. FIG. 2B shows a schematic diagram of a top view of the high-side power device 200. As shown in FIG. 2A, The high-side power device 200 includes: a substrate 201, an epitaxial layer 202, an isolation oxide region 203, a high voltage well 205, a body region 206, a contact region 206a, a buried region 207, a source 208, a drain 209, and a gate 211.

The substrate 201 having a first conductive type (for example but not limited to P-type) includes a top surface 201a and a bottom surface 201b opposite to the top surface 201a in a vertical direction (as shown by the dash arrow in the figure). The epitaxial layer 202 is formed on the substrate 201 by an epitaxial process step; the epitaxial layer 202 is stacked on and in contact with the top surface 201a of the substrate 201. The epitaxial layer 202 includes an epitaxial top surface 202a opposite to the top surface 201a. The isolation oxide region 203 is for example but not limited to a local oxidation of silicon (LOCOS) structure, and is formed on the epitaxial layer 202, for defining an operation region 203a as a major active region when the high-side power device 200 operates, wherein the body region 206, the source 208, and the drain 209 are all located in the operation region 203a from the cross-section view FIG. 2A and the top view FIG. 2B. The high voltage well 205 having a second conductive type (for example but not limited to N-type) is formed in the epitaxial layer 202, and is stacked on and in contact with the top surface 201a of the substrate 201 in the vertical direction.

Figure 3A:
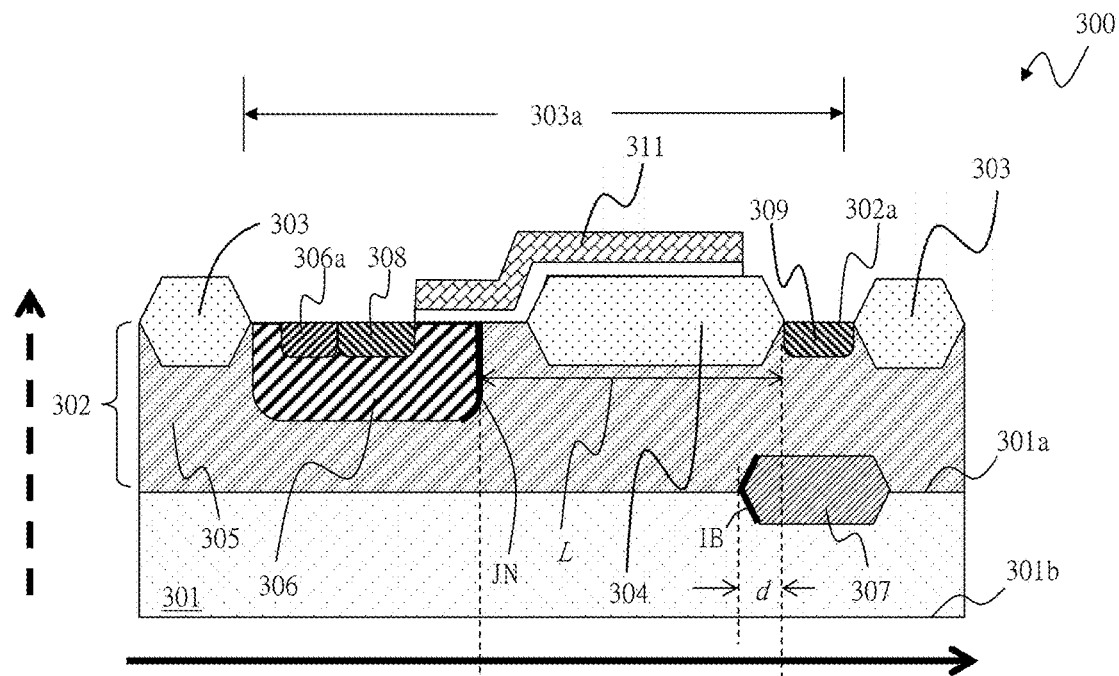
FIGS. 3A and 3B show a second embodiment of the present invention.
Figure 3B:
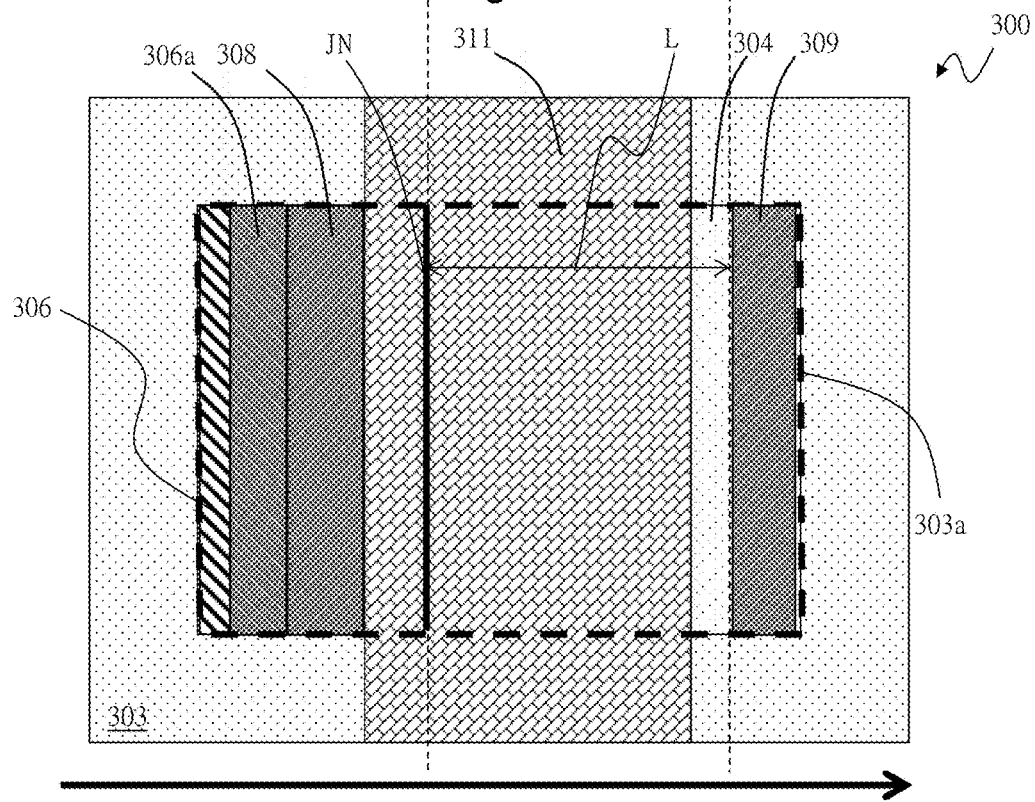

The body region 206 having the first conductive type (for example but not limited to the P-type) is formed in the epitaxial layer 202 beneath the epitaxial surface 202a, and connects the epitaxial surface 202a in the vertical direction, wherein the body region 206 and the high voltage well 205 form a channel junction JN (as indicated by thick solid lines shown in FIGS. 2A and 2B) in a channel direction (as indicated by solid arrows in FIGS. 3A and 3B). The gate 211 is formed on the epitaxial layer 202, and is stacked on and in contact with the epitaxial surface 202a in the vertical direction, wherein the gate 211 covers at least a part of the channel junction JN as shown in the cross-section view FIG. 2A and a top view FIG. 2B; in this embodiment, the gate 211 covers all the channel junction JN. The source 208 having the second conductive type (for example but not limited to the N-type) is formed in the epitaxial layer 202, and is stacked beneath and connects the epitaxial surface 202a in the vertical direction, wherein the source 208 is located in the body region 206 as shown in the cross-section view FIG. 2A and the top view FIG. 2B. The drain 209 having the second conductive type (for example but not limited to the N-type) is formed in the epitaxial layer 202, and is beneath and connects the epitaxial surface 202a. The drain 209 and the source 208 are located at different sides of the channel junction JN in the channel direction. The drain 209 and the gate 211 are separated by the high voltage well 205 as shown in the cross-section view FIG. 2A and the top view FIG. 2B.

The contact region 206a having the first conductive type (for example but not limited to the P-type) is formed in the epitaxial layer 202, and is stacked beneath and connects the epitaxial surface 202a, wherein the contact region 206a is located in the body region 206 as shown in the cross-section view FIG. 2A and the top view FIG. 2B. The buried region 207 having the second conductive type (for example but not limited to the N-type) is formed in the substrate 201 and the epitaxial layer 202, wherein a part of the buried region 207 (in this embodiment, for example the lower part) is located in the substrate 201 and another part (in this embodiment, for example the upper part) of the buried region 207 is located in the epitaxial layer 202 in the vertical direction, wherein an inner boundary IB of the buried region 207 is located between the drain 209 and the channel junction JN in the channel direction, and the buried region 207 is not located vertically under the source 208 as shown in FIG. 2A (that is, the buried region 207 does not overlap the source from the top view FIG. 2B). A concentration of the second conductive type impurities (N-type impurities in this embodiment) of the buried region 207 is sufficient (i.e., higher than a predetermined level) to prevent the high voltage well 205 between the channel junction JN and the drain 209 from being completely depleted in a conductive operation of the high-side power device 200.

The "operation region 203a", as understood by those skilled in this art, indicates a range in the high-side power device 200 wherein charged carriers are formed and/or moved to generate a current by applying a voltage which forms an electric field, during a normal operation (i.e., when the high-side power device 200 are controlled to be conductive and not conductive).

Besides, in a preferably embodiment, in the channel direction, a distance d between the inner boundary IB and the drain 209 in the channel direction is longer than a quarter of a drift length L between the channel junction JN and the drain 209 in the channel direction as shown in FIG. 2A.

Please refer to FIGS. 3A and 3B for a second embodiment according to the present invention. FIG. 3A shows a schematic diagram of a cross-section view of a high-side power device 300. FIG. 3B shows a schematic diagram of a top view of the high-side power device 300. As shown in FIG. 3A, The high-side power device 300 includes: a substrate 301, an epitaxial layer 302, an isolation oxide region 303, a drift oxide region 304, a high voltage well 305, a body region 306, a contact region 306a, a buried region 307, a source 308, a drain 309, and a gate 311.

The substrate 301 having the first conductive type (for example but not limited to the P-type) includes a top surface 301a and a bottom surface 301b opposite to the top surface 301a in a vertical direction (as shown by the dash arrow in the figure). The epitaxial layer 302 is formed on the substrate 301 by an epitaxial process step, i.e., the epitaxial layer 302 is stacked on and in contact with the top surface 301a of the substrate 301. The epitaxial layer 302 includes an epitaxial top surface 302a opposite to the top surface 201a. The isolation oxide region 303 is for example but not limited to the LOCOS structure, and is formed on the epitaxial layer 302, for defining an operation region 303a as a major active region when the high-side power device 300 operates, wherein the body region 306, the source 308, and the drain 309 are all located in the operation region 303a as shown in the cross-section view FIG. 3A and the top view FIG. 3B. The high voltage well 305 having the second conductive type (for example but not limited to N-type) is formed in the epitaxial layer 302, and is stacked on and in contact with the top surface 301a of the substrate 301 in the vertical direction.

The body region 306 having the first conductive type (for example but not limited to the P-type) is formed in the epitaxial layer 302 beneath the epitaxial surface 302a, and connects the epitaxial surface 302a in the vertical direction, wherein the body region 306 and the high voltage well 305 form a channel junction JN (as indicated by thick solid lines shown in FIGS. 3A and 3B) in a channel direction (as indicated by solid arrows in FIGS. 3A and 3B). The gate 311 is formed on the epitaxial layer 302, and is stacked on and in contact with the epitaxial surface 302a in the vertical direction, wherein the gate 311 covers at least a part of the channel junction JN as shown in the cross-section view FIG. 3A and the top view FIG. 3B; in this embodiment, the gate 311 covers all the channel junction JN. The source 308 having the second conductive type (for example but not limited to the N-type) is formed in the epitaxial layer 302, and is stacked beneath and connects the epitaxial surface 302a in the vertical direction, wherein the source 308 is located in the body region 306 as shown in the cross-section view FIG. 3A and the top view FIG. 3B. The drain 309 having the second conductive type (for example but not limited to the N-type) is formed in the epitaxial layer 302, and is beneath and connects the epitaxial surface 302a. The drain 309 and the source 308 are located at different sides of the channel junction JN in the channel direction. The drain 309 and the gate 311 are separated by the high voltage well 305 as shown in the cross-section view FIG. 3A and the top view FIG. 3B.

The contact region 306a having the first conductive type (for example but not limited to the P-type) is formed in the epitaxial layer 302, and is stacked beneath and connects the epitaxial surface 302a, wherein the contact region 306a is located in the body region 306 as shown in the cross-section view FIG. 3A and the top view FIG. 3B. The buried region 307 having the second conductive type (for example but not limited to the N-type) is formed in the substrate 301 and the epitaxial layer 302, wherein a part of the buried region 307 (in this embodiment, for example the lower part) is located in the substrate 301 and another part (in this embodiment, for example the upper part) of the buried region 307 is located in the epitaxial layer 302 in the vertical direction, wherein an inner boundary IB of the buried region 307 is located between the drain 309 and the channel junction JN in the channel direction, and the buried region 307 is not located vertically under the source 308 as shown in FIG. 3A (that is, the buried region 307 does not overlap the source 308 from the top view FIG. 3B). A concentration of the second conductive type impurities (N-type impurities in this embodiment) of the buried region 307 is sufficient (i.e., higher than a predetermined level) to prevent the high voltage well 305 between the channel junction JN and the drain 309 from being completely depleted in a conductive operation of the high-side power device 300.

The "operation region 303a", as understood by those skilled in this art, indicates a range in the high-side power device 300 wherein charged carriers are formed and/or moved to generate a current by applying a voltage which forms an electric field, during a normal operation (i.e., when the high-side power device 200 are controlled to be conductive and not conductive).

Besides, in a preferably embodiment, in the channel direction, a distance d between the inner boundary IB and the drain 309 in the channel direction is longer than a quarter of a drift length L between the channel junction JN and the drain 309 in the channel direction as shown in FIG. 3A.

The drift oxide region 304 is formed in the operation region 303a on the epitaxial layer 302, and is stacked on and in contact with the high voltage well 305 in the vertical direction, wherein the drift oxide region 304 is located between the channel junction JN and the drain 309 in the channel direction.

Figure 4A:
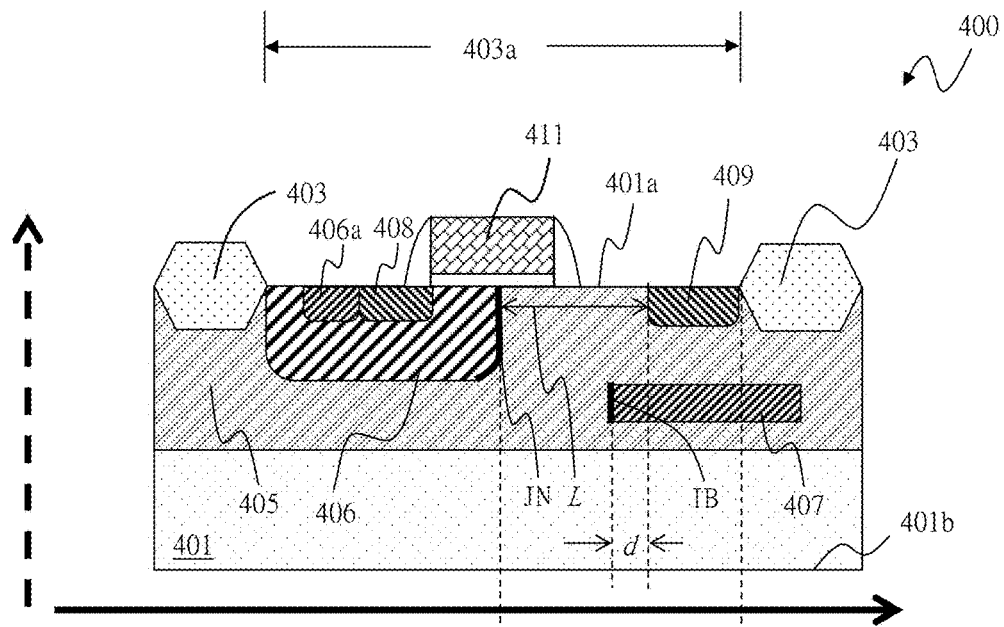
FIGS. 4A and 4B show a third embodiment of the present invention.
Figure 4B:
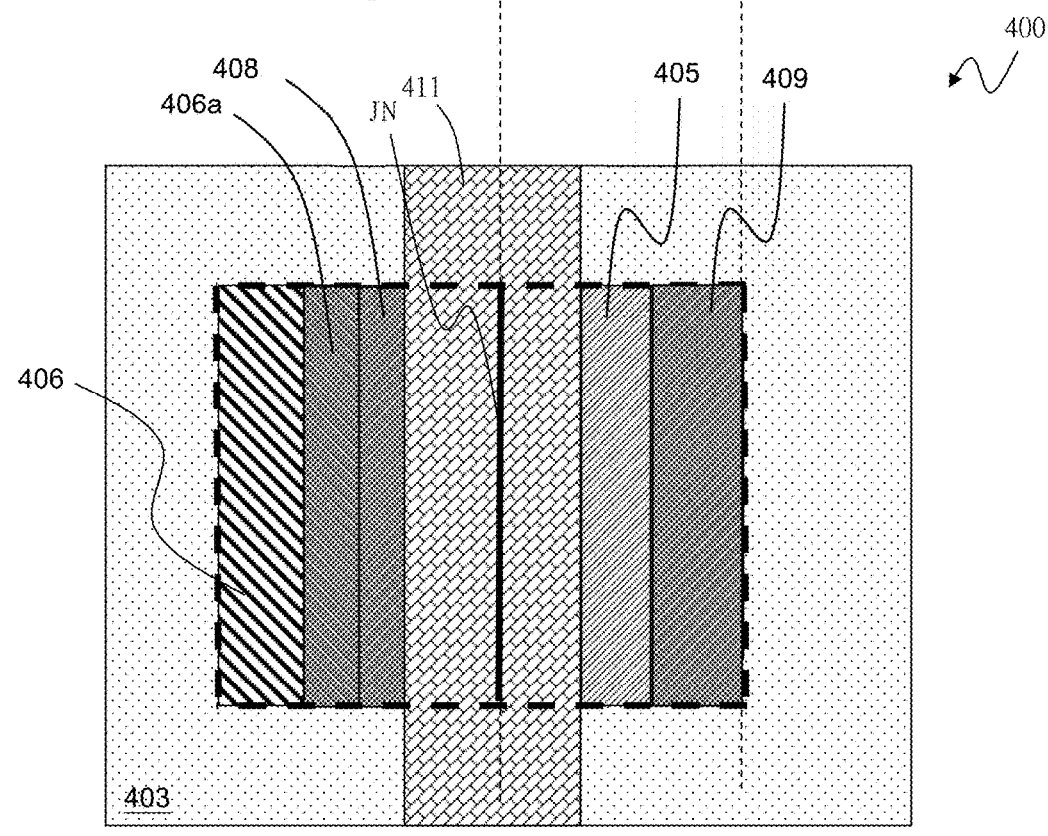

Please refer to FIGS. 4A and 4B for a third embodiment according to the present invention. FIG. 4A shows a schematic diagram of a cross-section view of a high-side power device 400. FIG. 4B shows a schematic diagram of a top view of the high-side power device 400. As shown in FIG. 4A, The high-side power device 400 includes: a substrate 401, an isolation oxide region 403, a high voltage well 405, a body region 406, a contact region 406a, a buried region 407, a source 408, a drain 409, and a gate 411.

The substrate 401 having the first conductive type (for example but not limited to the P-type) includes a top surface 401a and a bottom surface 401b opposite to the top surface 401a in a vertical direction (as shown by the dash arrow in the figure). The isolation oxide region 403 is for example but not limited to the LOCOS structure, and is formed on the substrate 401, for defining an operation region 403a as a major active region when the high-side power device 400 operates, wherein the body region 406, the source 408, and the drain 409 are all located in the operation region 403a as shown in the cross-section view FIG. 4A and the top view FIG. 4B. The high voltage well 405 having the second conductive type (for example but not limited to the N-type) is formed in the substrate 401.

The body region 406 having the first conductive type (for example but not limited to the P-type) is formed in the substrate 401 beneath the top surface 401a, and connects the top surface 401a in the vertical direction, wherein the body region 406 and the high voltage well 405 form a channel junction JN (as indicated by thick solid lines shown in FIGS. 4A and 4B) in a channel direction (as indicated by solid arrows in FIGS. 4A and 4B). The gate 411 is formed on the substrate 401, and is stacked on and in contact with the top surface 401a in the vertical direction, wherein the gate 411 covers at least a part of the channel junction JN as shown in the cross-section view FIG. 4A and the top view FIG. 4B; in this embodiment, the gate 411 covers all the channel junction JN. The source 408 having the second conductive type (for example but not limited to the N-type) is formed in the substrate 401, and is stacked beneath and connects the top surface 401a in the vertical direction, wherein the source 408 is located in the body region 406 as shown in the cross-section view FIG. 4A and the top view FIG. 4B. The drain 409 having the second conductive type (for example but not limited to the N-type) is formed in the substrate 401, and is beneath and connects the top surface 401a. The drain 409 and the source 408 are located at different sides of the channel junction JN in the channel direction. The drain 409 and the gate 411 are separated by the high voltage well 405 as shown in the cross-section view FIG. 4A and the top view FIG. 4B.

The contact region 406a having the first conductive type (for example but not limited to the P-type) is formed in the substrate 401, and is stacked beneath and connects the top surface 401a, wherein the contact region 406a is located in the body region 406 as shown in the cross-section view FIG. 4A and the top view FIG. 4B. The buried region 407 having the second conductive type (for example but not limited to the N-type) is formed in the substrate 401, and is located vertically below the drain 409 in the vertical direction, wherein an inner boundary IB of the buried region 407 is located between the drain 409 and the channel junction JN in the channel direction, and the buried region 407 is not located vertically under the source 408 as shown in FIG. 4A (that is, the buried region 407 does not overlap the source 408 from the top view FIG. 4B). A concentration of the second conductive type impurities (N-type impurities in this embodiment) of the buried region 407 is sufficient (i.e., higher than a predetermined level) to prevent the high voltage well 405 between the channel junction JN and the drain 409 from being completely depleted in a conductive operation of the high-side power device 400.

The "operation region 403a", as understood by those skilled in this art, indicates a range in the high-side power device 200 wherein charged carriers are formed and/or moved to generate a current by applying a voltage which forms an electric field, during a normal operation (i.e., when the high-side power device 400 are controlled to be conductive and not conductive).

Besides, in a preferably embodiment, in the channel direction, a distance d between the inner boundary IB and the drain 409 in the channel direction is longer than a quarter of a drift length L between the channel junction JN and the drain 409 in the channel direction as shown in FIG. 4A.

Figure 5A:
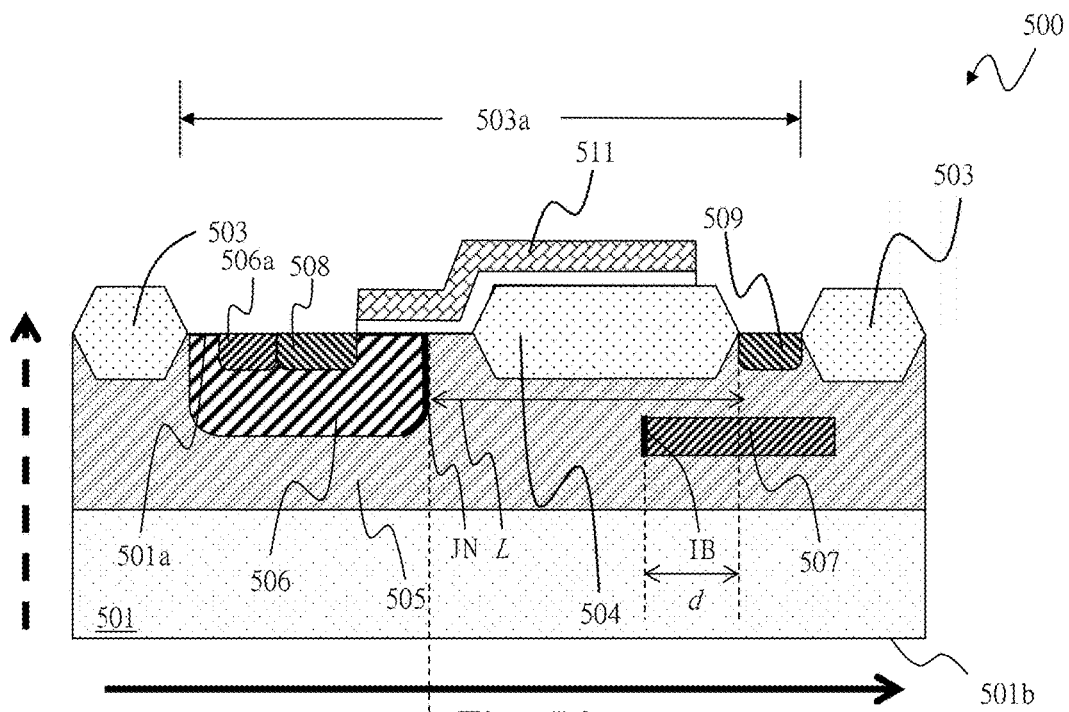
FIGS. 5A and 5B show a fourth embodiment of the present invention.
Figure 5B:
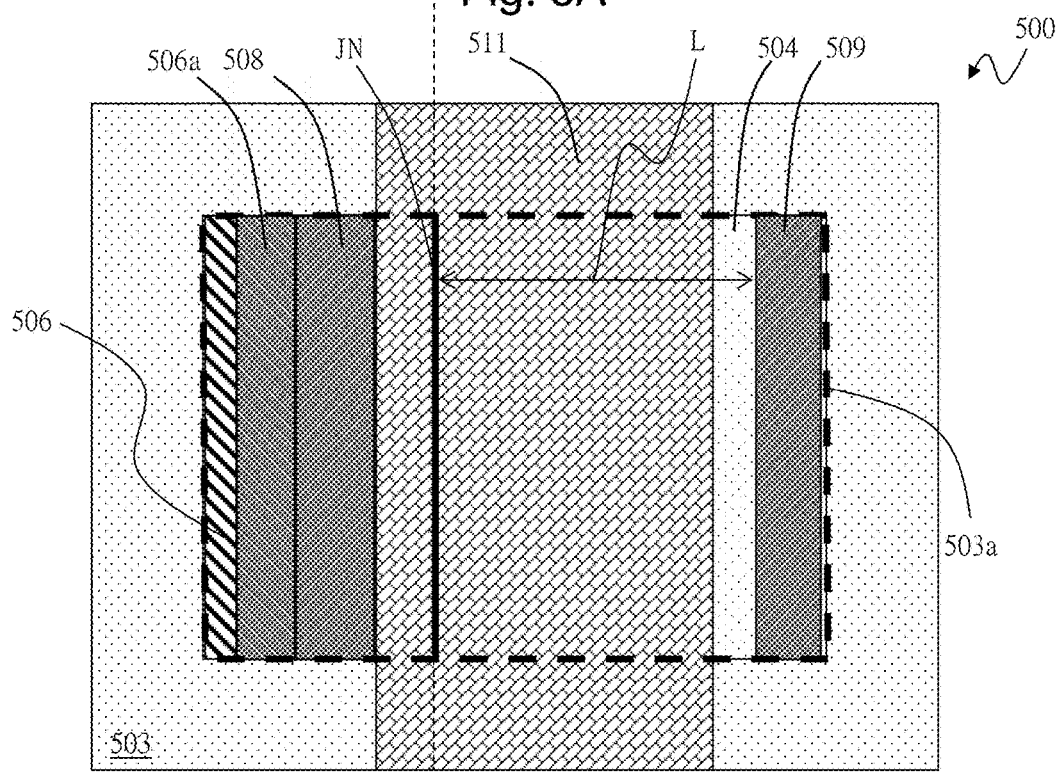

Please refer to FIGS. 5A and 5B for a fourth embodiment according to the present invention. FIG. 5A shows a schematic diagram of a cross-section view of a high-side power device 500. FIG. 5B shows a schematic diagram of a top view of the high-side power device 500. As shown in FIG. 5A, The high-side power device 500 includes: a substrate 501, an isolation oxide region 503, a drift oxide region 504, a high voltage well 505, a body region 506, a contact region 506a, a buried region 507, a source 508, a drain 509, and a gate 511.

The substrate 501 having the first conductive type (for example but not limited to the P-type) includes a top surface 501a and a bottom surface 501b opposite to the top surface 501a in a vertical direction (as shown by the dash arrow in the figure). The isolation oxide region 503 is for example but not limited to the LOCOS structure, and is formed on the substrate 501, for defining an operation region 503a as a major active region when the high-side power device 500 operates, wherein the body region 506, the source 508, and the drain 509 are all located in the operation region 503a as shown in the cross-section view FIG. 5A and the top view FIG. 5B. The high voltage well 505 having the second conductive type (for example but not limited to the N-type) is formed in the substrate 401.

The body region 506 having the first conductive type (for example but not limited to the P-type) is formed in the substrate 501 beneath the top surface 501a, and connects the top surface 501a in the vertical direction, wherein the body region 506 and the high voltage well 505 form a channel junction JN (as indicated by thick solid lines shown in FIGS. 5A and 5B) in a channel direction (as indicated by solid arrows in FIGS. 5A and 5B). The gate 511 is formed on the substrate 501, and is stacked on and in contact with the top surface 501a in the vertical direction, wherein the gate 511 covers at least a part of the channel junction JN as shown in the cross-section view FIG. 5A and the top view FIG. 5B; in this embodiment, the gate 511 covers all the channel junction JN. The source 508 having the second conductive type (for example but not limited to the N-type) is formed in the substrate 501, and is stacked beneath and connects the top surface 501a in the vertical direction, wherein the source 508 is located in the body region 506 as shown in the cross-section view FIG. 5A and the top view FIG. 5B. The drain 509 having the second conductive type (for example but not limited to the N-type) is formed in the substrate 501, and is beneath and connects the top surface 501a. The drain 509 and the source 508 are located at different sides of the channel junction JN in the channel direction. The drain 509 and the gate 511 are separated by the high voltage well 505 as shown in the cross-section view FIG. 5A and the top view FIG. 5B.

The contact region 506a having the first conductive type (for example but not limited to the P-type) is formed in the substrate 501, and is stacked beneath and connects the top surface 501a, wherein the contact region 506a is located in the body region 506 as shown in the cross-section view FIG. 5A and the top view FIG. 5B. The buried region 507 having the second conductive type(for example but not limited to the N-type) is formed in the substrate 501, and is located vertically below the drain 509 in the vertical direction, wherein an inner boundary IB of the buried region 507 is located between the drain 509 and the channel junction JN in the channel direction, and the buried region 507 is not located vertically under the source 508 as shown in FIG. 5A (that is, the buried region 507 does not overlap the source 508 from the top view FIG. 5B). A concentration of the second conductive type impurities (N-type impurities in this embodiment) of the buried region 507 is sufficient (i.e., higher than a predetermined level) to prevent the high voltage well 505 between the channel junction JN and the drain 509 from being completely depleted in a conductive operation of the high-side power device 500.

The "operation region 503a", as understood by those skilled in this art, indicates a range in the high-side power device 500 wherein charged carriers are formed and/or moved to generate a current by applying a voltage which forms an electric field, during a normal operation (i.e., when the high-side power device 200 are controlled to be conductive and not conductive).

Besides, in a preferably embodiment, in the channel direction, a distance d between the inner boundary IB and the drain 509 in the channel direction is longer than a quarter of a drift length L between the channel junction JN and the drain 509 in the channel direction as shown in FIG. 5A.

The drift oxide region 504 is formed in the operation region 503a on the substrate 501, and is stacked on and in contact with the high voltage well 505 in the vertical direction, wherein the drift oxide region 504 is located between the channel junction JN and the drain 509 in the channel direction.

FIGS. 6A-6L show a fifth embodiment of the present invention. This embodiment shows an example of a manufacturing method of the high-side power device 300 of the second embodiment according to the present invention from top views and cross-section views. For better understanding, top views and cross-section views of the high-side power device 300 are shown in parallel at left and right sides.

Figure 6A:
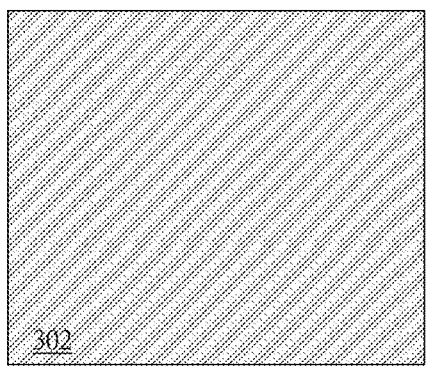
FIGS. 6A-6L show a fifth embodiment of the present invention.
Figure 6B:
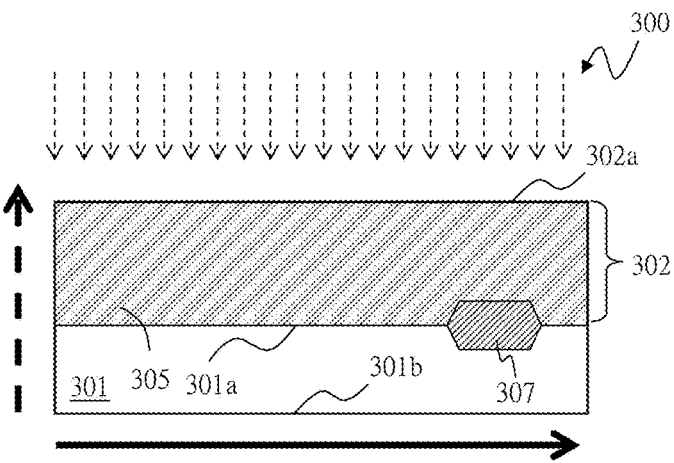

As shown in the top view FIG. 6A and cross-section view FIG. 6B, the substrate 301 is provided, wherein the substrate 301 is for example but not limited to a P-type silicon substrate (or a P-type semiconductor substrate of another material). The substrate 301 includes a top surface 301*a* and a bottom surface 301*b* opposite to the top surface 301*a* in the vertical direction (as shown by the dash arrow in FIG. 6B). Next, as shown in FIGS. 6A and 6B, the epitaxial layer 302 is formed on the substrate 301, which has an epitaxial surface 302*a* opposite to the top surface 301*a* in the vertical direction, and is stacked on and in contact with at least a portion of the top surface 301*a* of the substrate 301. Next, for example an ion implantation process step is taken to implant second conductive type impurities in the form of accelerated ions, as indicated by the dash arrow lines shown in FIG. 6B. The high voltage well 305 having the second conductive type (for example but not limited to the N-type) is formed in the epitaxial layer 302, and is stacked on and in contact with the top surface 301*a* of the substrate 301 in the vertical direction.

The buried region 307 having the second conductive type (for example but not limited to the N-type) is formed in the substrate 301 and in the epitaxial layer 302, wherein a part of the buried region 307 (in this embodiment, for example the lower part) is located in the substrate 301 and another part (in this embodiment, for example the upper part) of the buried region 307 is located in the epitaxial layer 302 in the vertical direction. The buried region 307 can be formed for example by the following steps. First, the location of the buried region 307 is defined by for example but not limited to a photoresist mask formed by a lithography process step (not shown), and an ion implantation process step implants for example but not limited to N-type impurities to the defined region in the form of accelerated ions. An implantation region of the buried region 307 is formed in the substrate 301. Next, the photoresist mask is removed, and next, after the epitaxial layer 302 is formed, an anneal process step thermally diffuses a part of the N-type impurities in the implantation region of the buried region 307 to the epitaxial layer 302, such that the buried region 307 is formed to be located partially in the substrate 301 and partially in the epitaxial layer 302.

Figure 6C:
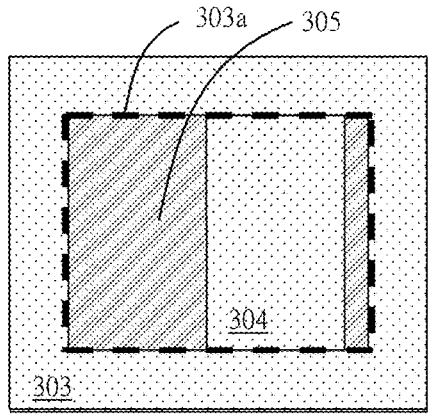
Figure 6D:
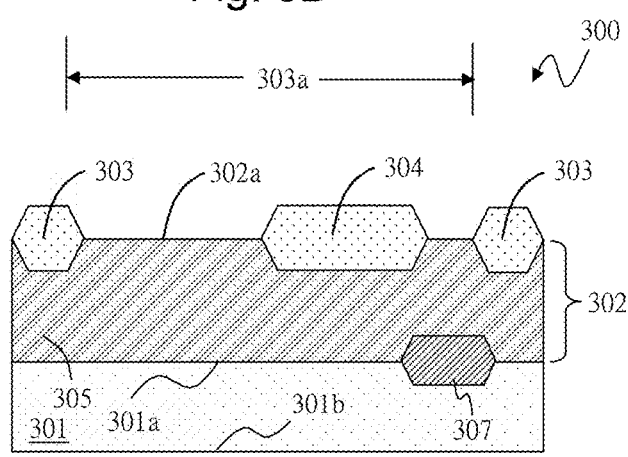

Next, as shown in the top view FIG. 6C and cross-section view FIG. 6D, the isolation oxide region 303 is formed on the epitaxial layer 302, for defining the operation region 303*a*, and the drift oxide region 304 is formed in the operation region 303*a* on the epitaxial layer 302 concurrently with or after the formation of the isolation oxide region 303, wherein the drift oxide region 304 is stacked on and in contact with the high voltage well 305 in the vertical direction. The isolation oxide region 303 and the drift oxide region 304 are for example but not limited to the LOCOS structure as shown in the figure; in another embodiment, the isolation oxide region 303 and the drift oxide region 304 may be a shallow trench isolation (STI) structure instead.

Figure 6E:
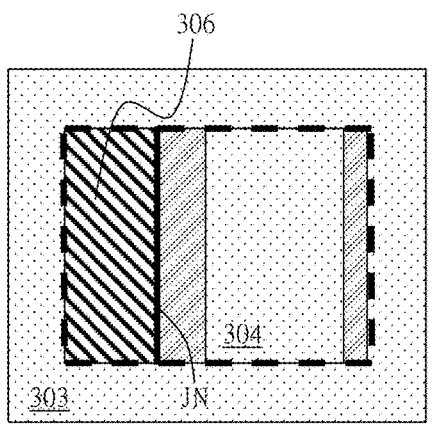
Figure 6F:
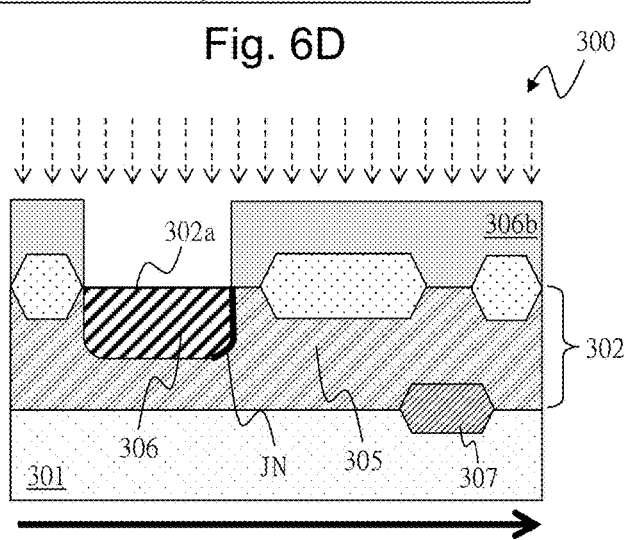

Next, as shown in the top view FIG. 6E and cross-section view FIG. 6F, the body region 306 having the first conductive type (for example but not limited to the P-type) is formed in the epitaxial layer 302 beneath the epitaxial surface 302*a*, and connects the epitaxial surface 302*a* in the vertical direction, wherein the body region 306 and the high voltage well 305 form a channel junction JN (as indicated by thick solid lines shown in FIGS. 6E and 6F) in a channel direction (as indicated by solid arrows in FIG. 6F).

The body region 306 is defined by for example but not limited to a photoresist mask 306*b* formed by a lithography process step, and an ion implantation process step implants for example but not limited to P-type impurities to the defined region in the form of accelerated ions. An implantation region of the body region 306 is formed in the substrate 301. Next, the photoresist mask 306*b* is removed.

Figure 6G:
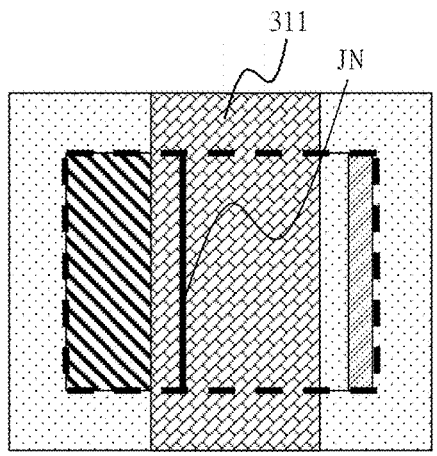
Figure 6H:
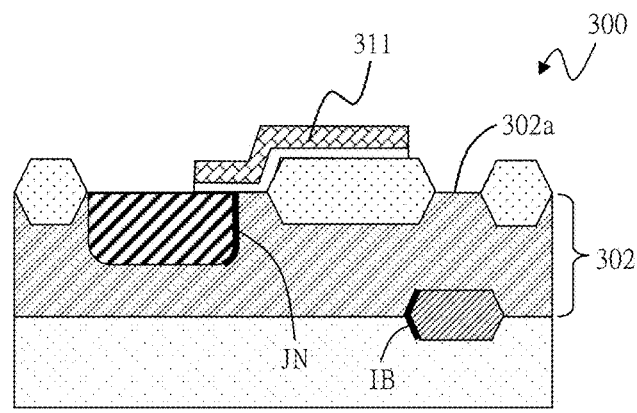

Next, as shown in the top view FIG. 6G and cross-section view FIG. 6H, the gate 311 is formed on the epitaxial layer 302, which is stacked on and in contact with the epitaxial surface 302*a* of the epitaxial layer 302 in the vertical direction, wherein the gate 311 covers at least a part of the channel junction JN as shown in the cross-section view FIG. 6H and the top view FIG. 6G; in this embodiment, the gate 311 covers all the channel junction JN.

Figure 6I:
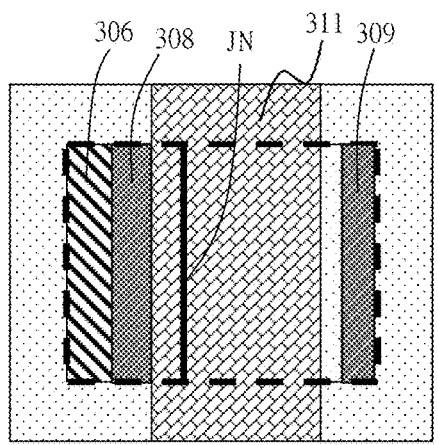
Figure 6J:
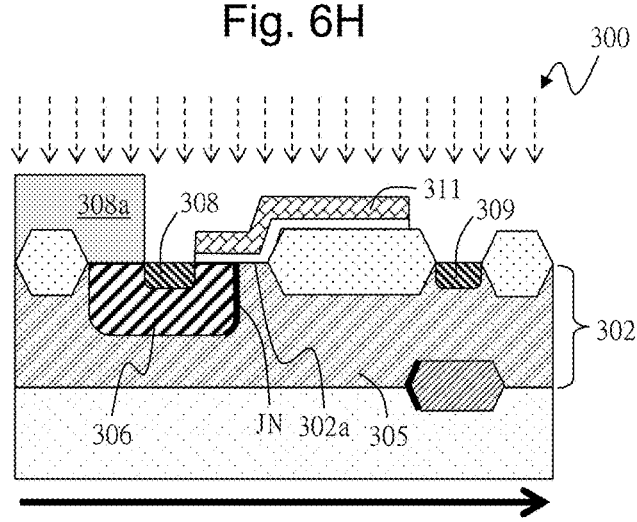

Next, as shown in the top view FIG. 6I and cross-section view FIG. 6J, the source 308 and the drain 309 having the second conductive type (for example but not limited to the N-type) are formed in the epitaxial layer 302, and are stacked beneath and connect the epitaxial surface 302*a* in the vertical direction, wherein the source 308 is located in the body region 306 and the drain 309 is formed in the epitaxial layer 302 as shown in the cross-section view FIG. 6J and the top view FIG. 6I. The source 308 and the drain 309 are located at different sides of the channel junction JN in the channel direction. The drain 309 and the gate 311 are separated by the high voltage well 305 as shown in the cross-section view FIG. 6J and the top view FIG. 6I. In a conductive operation of the N-type high-side power device 300, for example, a current flows from the N-type drain 309 through the high voltage well 305 and the body region 306 to the source 308. By applying a positive voltage to the gate 311, a channel is formed around a junction between the P-type body region 306 and the gate 311, and thus in the conductive operation, the conductive current flows from the drain 309 to the source 308.

The source 308 and the drain 309 are formed by for example but not limited to a same lithography process step and a same ion implantation process step. As shown in FIG. 6J, the N-type source 308 and the drain 309 are defined by for example but not limited to the gate 311 together with a photoresist mask 308*a* formed by the lithography process step, and the ion implantation process step implants for example but not limited to N-type impurities to the defined regions in the form of accelerated ions as indicated by the dash arrow lines shown in FIG. 6J. The N-type source 308 and the N-type drain 309 are formed beneath and connect the epitaxial surface 302*a*.

Figure 6K:
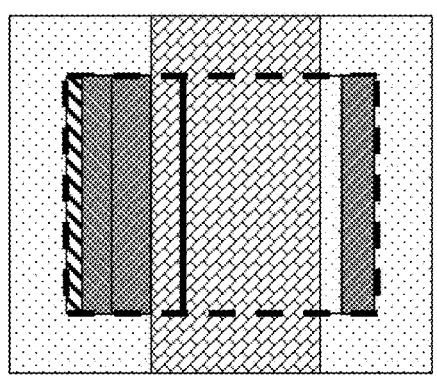
Figure 6L:
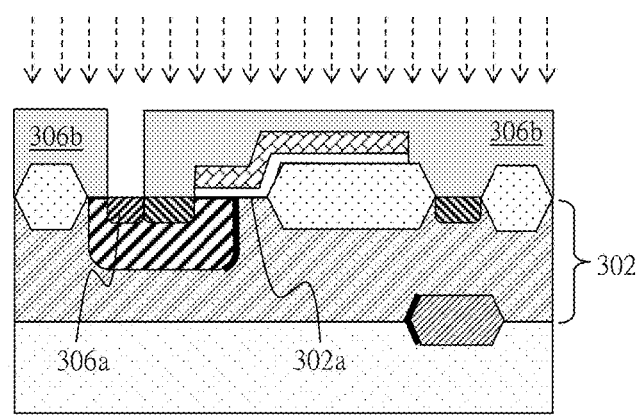

Next, as shown in the top view FIG. 6K and cross-section view FIG. 6L, the contact region 306*a* having the first conductive type (for example but not limited to the P-type) is formed in the epitaxial layer 302, and is stacked beneath and connects the epitaxial surface 302*a*. The contact region 306*a* is defined by for example but not limited to a photoresist mask 306*b* formed by a lithography process step, and an ion implantation process step implants for example but not limited to P-type impurities to the defined region in the form of accelerated ions. An implantation region of the contact region 306a is formed in the epitaxial layer 302. Next, the photoresist mask 306b is removed, and next, an anneal process step anneals the P-type impurities in the implantation region of the contact region 306a, to form the contact region 306a.

Figure 7A:
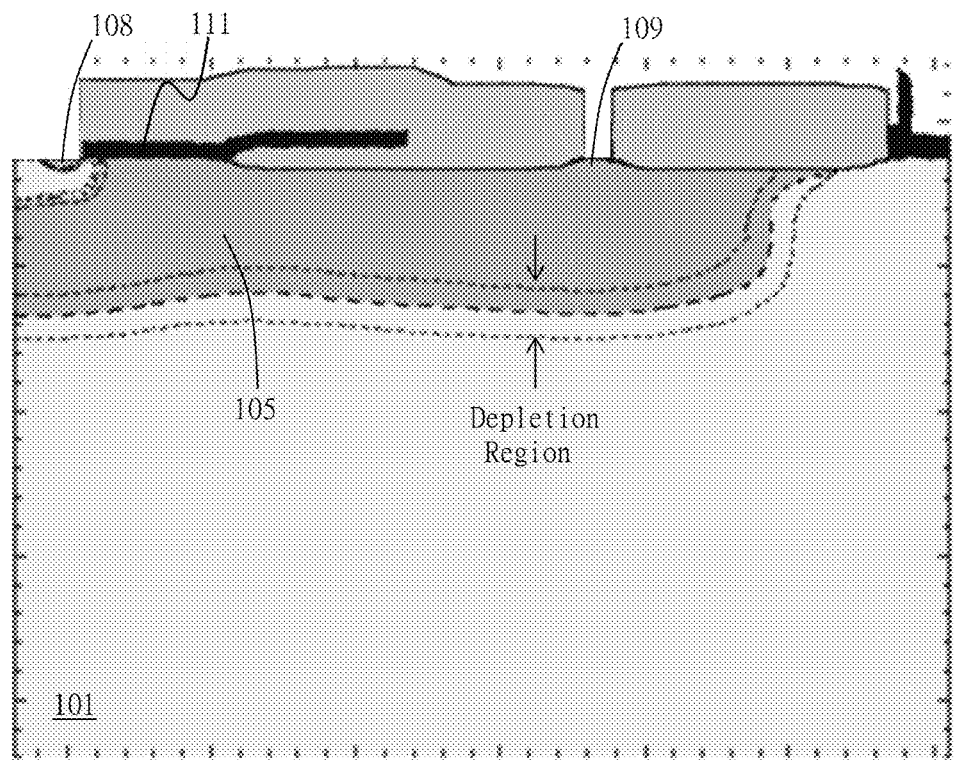
FIGS. 7A and 7B show simulation diagrams of a depleted region of the prior art high-side power device 100 when different voltages are applied thereto.
Figure 7B:
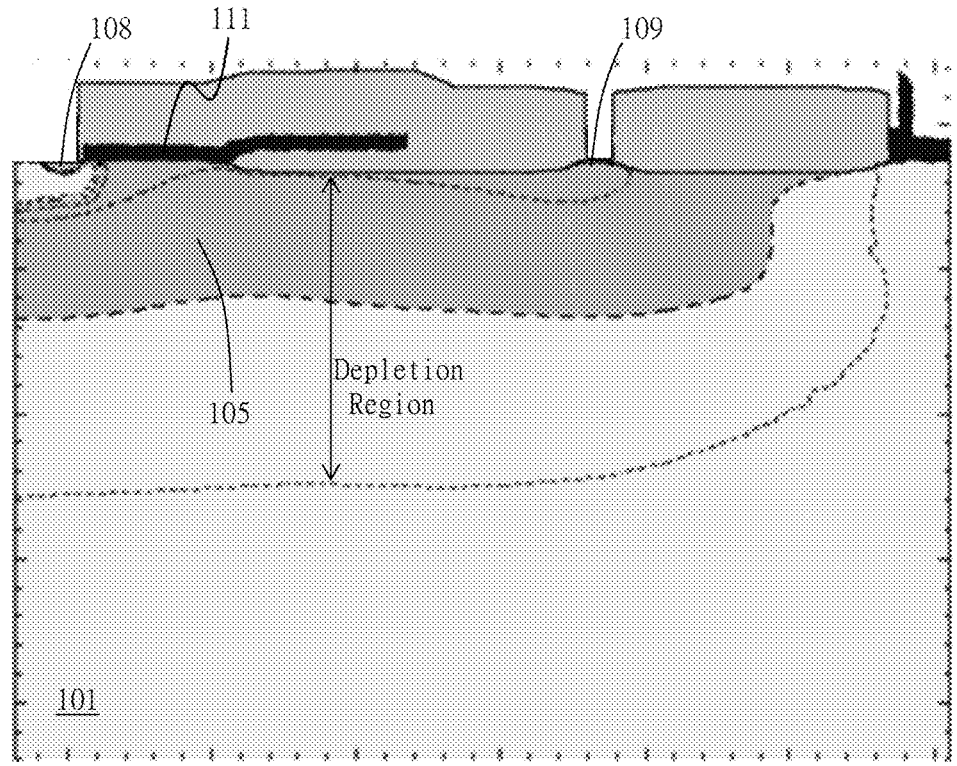

FIGS. 7A and 7B show simulation diagrams of a depleted region of the prior art high-side power device 100 when different voltages are applied thereto. FIG. 7A shows the simulation result when 0.1V is applied to the drain 109, 5V is applied to the gate 111, and the substrate 101 is electrically connected to 0V. As shown in the figure, a depleted region is formed around a lower boundary of the high voltage well 105 of the high-side power device 100, wherein the depleted region is shown as an area between an upper and a lower dash lines. A conductive resistance of the high-side power device 100 shown in FIG. 7A is 231 mOhm-mm2. FIG. 7B shows the simulation result when 0.1V is applied to the drain 109, 5V is applied to the gate 111, and the substrate 101 is electrically connected to −80V. As shown in the figure, a depleted region is formed around a lower boundary of the high voltage well 105 of the high-side power device 100, wherein the depleted region is shown as an area between an upper and a lower dash lines. A conductive resistance of the high-side power device 100 shown in FIG. 7B is 1284 mOhm-mm2. Typically, it is required to connect the substrate of a high-side power device to a high voltage, for example but not limited to the aforementioned voltage −80V. FIG. 7B shows that under such circumstance, the channel of the high-side power device 100 is almost completely pinched off, resulting in the high conductive resistance 1284 mOhm-mm2, which is more than five times of the conductive resistance 231 mOhm-mm2 shown in FIG. 7A and is greatly undesired.

Figure 8A:
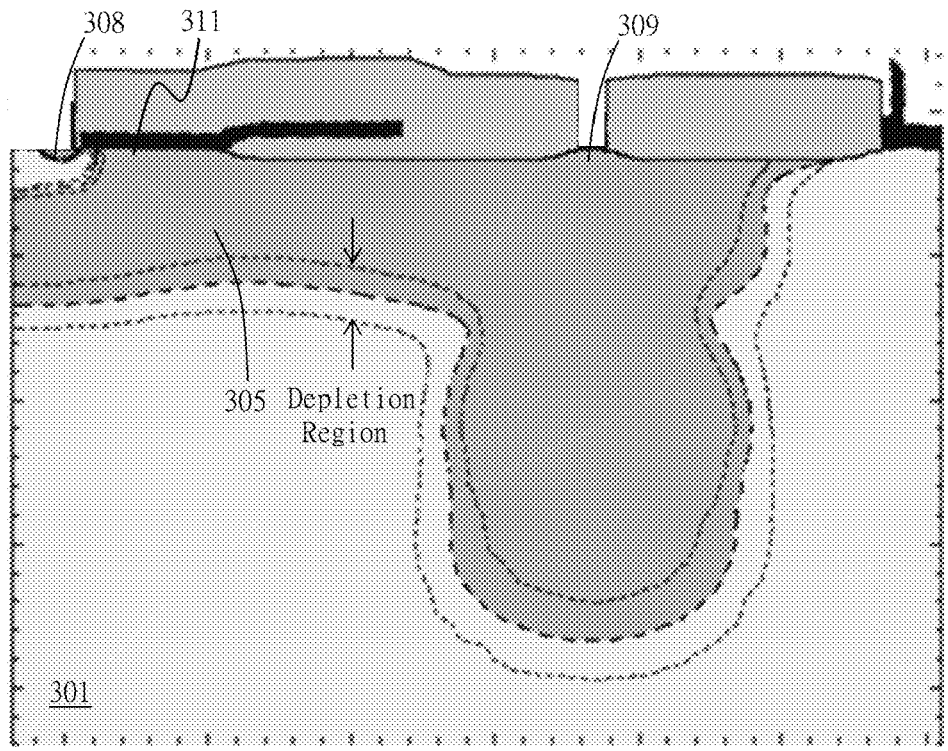
FIGS. 8A and 8B show simulation diagrams of a depleted region of the high-side power device 300 according to the present invention when different voltages are applied thereto.
Figure 8B:
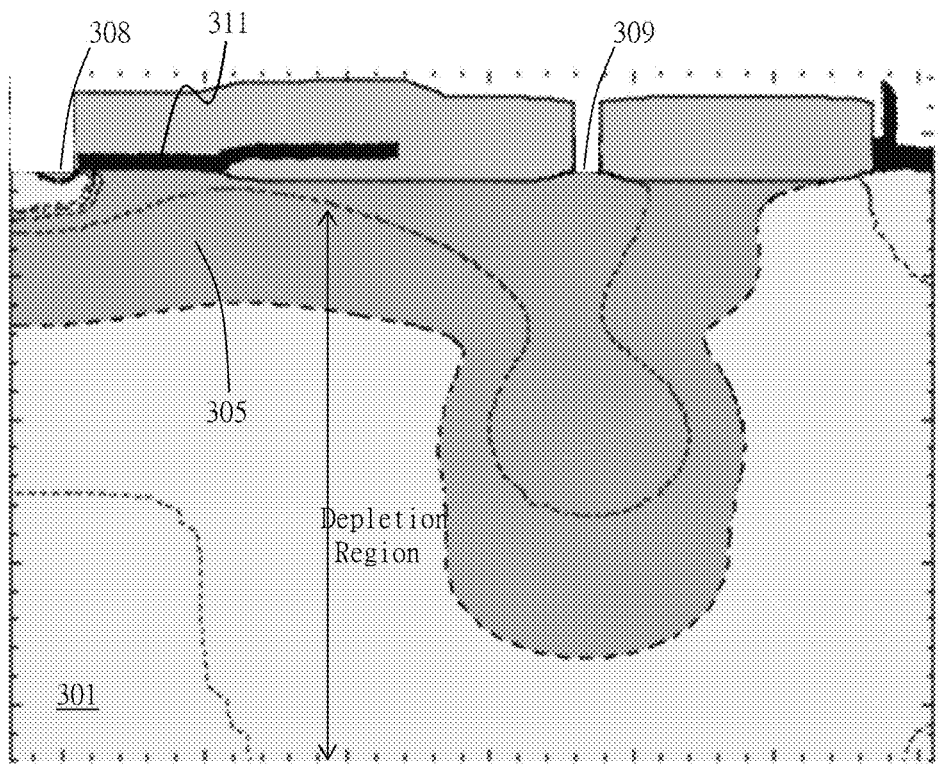

FIGS. 8A and 8B show simulation diagrams of a depleted region of the high-side power device 300 according to the present invention when different voltages are applied thereto. FIG. 8A shows the simulation result when 0.1V is applied to the drain 309, 5V is applied to the gate 311, and the substrate 301 is electrically connected to 0V. As shown in the figure, a depleted region is formed around a lower boundary of the high voltage well 305 of the high-side power device 300, wherein the depleted region is shown as an area between an upper and a lower dash lines. A conductive resistance of the high-side power device 300 shown in FIG. 8A is 226 mOhm-mm2. FIG. 8B shows the simulation result when 0.1V is applied to the drain 309, 5V is applied to the gate 311, and the substrate 301 is electrically connected to −80V. A conductive resistance of the high-side power device 300 shown in FIG. 8B is 413 mOhm-mm2. In the normal operation of the high-side power device 300, the substrate 301 can be electrically connected to a high voltage, for example but not limited to the aforementioned voltage −80V. FIG. 8B shows that when the high-side power device 300 operates in the normal operation, the channel is not completely pinched off, and the conductive resistance is as low as 413 mOhm-mm2, not even twice the conductive resistance 226 mOhm-mm2 shown in FIG. 8A. The present invention is apparently advantageous over the prior art because of the relatively lower conductive resistance, and the application range of the high side power device of the present invention is much broader.

The present invention has been described in considerable detail having reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography or other lithography techniques. For another example, the conductive types of the P-type and the N-type of all the embodiments are interchangeable, with corresponding modifications in the conductive types and/or impurity concentrations in corresponding regions. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A manufacturing method of a high-side power device, comprising:
    forming a substrate having a first conductive type, which includes a top surface and a bottom surface opposite to the top surface in a vertical direction;
    forming a high voltage well having a second conductive type in the substrate, wherein the high voltage well is beneath the top surface in the vertical direction;
    forming a body region having the first conductive type in the substrate beneath the top surface, wherein the body region and the high voltage well form a channel junction in a channel direction;
    forming a gate on the substrate, wherein the gate is stacked on and in contact with the top surface in the vertical direction, wherein the gate covers at least a part of the channel junction from a top view;
    forming a source having the second conductive type in the substrate, wherein the source is beneath and connects the top surface in the vertical direction, and wherein the source is located in the body region from the top view;
    forming a drain having the second conductive type in the epitaxial layer, the drain being beneath and connecting the epitaxial surface, wherein the drain and the source are located at different sides of the channel junction in the channel direction, and wherein the drain and the gate are separated by the high voltage well from the top view; and
    forming a buried region having the second conductive type in the substrate, wherein the buried region is located below the drain in the vertical direction, wherein at least part of the buried region is located right below a channel region between the drain and the channel junction, and the buried region is not located vertically under the source and does not overlap the source from the top view, wherein an inner boundary of the buried region includes a junction between the buried region and the high voltage well, wherein the inner boundary is right below the channel region;
    wherein an impurity concentration of the second conductive type of the buried region is higher than a predetermined level to prevent the high voltage well between the channel junction and the drain from being completely depleted in a conductive operation.

2. The manufacturing method of claim 1, wherein a distance between the inner boundary and the drain in the channel direction is longer than a quarter of a drift length between the channel junction and the drain in the channel direction.

3. The manufacturing method of claim 1, further comprising forming an isolation oxide region on the substrate, for defining an operation region, wherein the body region, the source, and the drain are all located in the operation region from the top view.

4. The manufacturing method of claim 1, further comprising forming a drift oxide region in the operation region on the substrate, wherein the drift oxide region is stacked on and in contact with the high voltage well in the vertical direction, and is located between the channel junction and the drain in the channel direction.

5. The manufacturing method of claim 1, further comprising forming a contact region having the first conductive type in the substrate, wherein the contact region is stacked beneath and connects the top surface, and is located in the body region from the top view.

* * * * *